United States Patent [19]

Mach et al.

[11] 4,305,035

[45] Dec. 8, 1981

[54] MAGNETIC FIELD AMPLITUDE DETECTION SENSOR APPARATUS

[75] Inventors: Dedina O. Mach, Cedar Rapids; Roger E. Wiegel, Toddville, both of Iowa

[73] Assignee: Rockwell International Corporation, El Segundo, Calif.

[21] Appl. No.: 68,832

[22] Filed: Aug. 22, 1979

[51] Int. Cl.³ ............................................. G01R 33/04
[52] U.S. Cl. ................................................. 324/255
[58] Field of Search ............................... 324/253–255, 324/117 R

[56] References Cited

U.S. PATENT DOCUMENTS

| | | | |
|---|---|---|---|
| 2,560,132 | 7/1951 | Schmitt | 324/255 |
| 2,752,564 | 6/1956 | Ryerson | 324/255 |
| 2,809,345 | 10/1957 | Wickerham et al. | 324/255 |
| 2,938,164 | 5/1960 | Hansburg | 324/255 |
| 3,258,687 | 6/1966 | Heppner et al. | 324/253 |
| 3,460,029 | 8/1969 | Guillemin | 324/255 |
| 3,541,432 | 11/1970 | Scarbrough | 324/255 |
| 3,761,725 | 9/1973 | Meyer | 250/566 |
| 3,882,387 | 5/1975 | Vikstrom | 324/117 R |
| 3,983,475 | 9/1976 | Watanabe et al. | 324/254 |
| 4,059,796 | 11/1977 | Rhodes | 324/253 |

Primary Examiner—Gerard R. Strecker
Attorney, Agent, or Firm—Bruce C. Lutz; Richard A. Bachand; H. Fredrick Hamman

[57] ABSTRACT

A magnetic field sensor is illustrated which in one useful application comprised two orthogonally positioned coils each having its own electronics and each wound on separate small strips of core material and positioned in a gimballed fixture for use as an electronic compass. The sensing coils in each sensor sense only the components of magnetic field in that plane with one output being representative of the field along the axis of one of the coils and the other being representative of the field along the axis of the other coil. A secondary winding cooperating with each of these coils provides an output signal which is operated upon to remove any DC components and provide a signal indicative in waveshape of the flux in the core. Opposite polarity peak detectors are then used to determine the relative peak voltages with respect to ground for the purpose of determining the DC component which had been removed. The DC component is indicative of any external fields affecting the flux levels in the core material. The DC value is obtained by summing the outputs of the two peak detectors and accumulating the results prior to using this as an apparatus output and as a feedback signal to cancel the effects of the external field in the core and thus maintain maximum sensitivity of the sensor mechanism.

7 Claims, 3 Drawing Figures

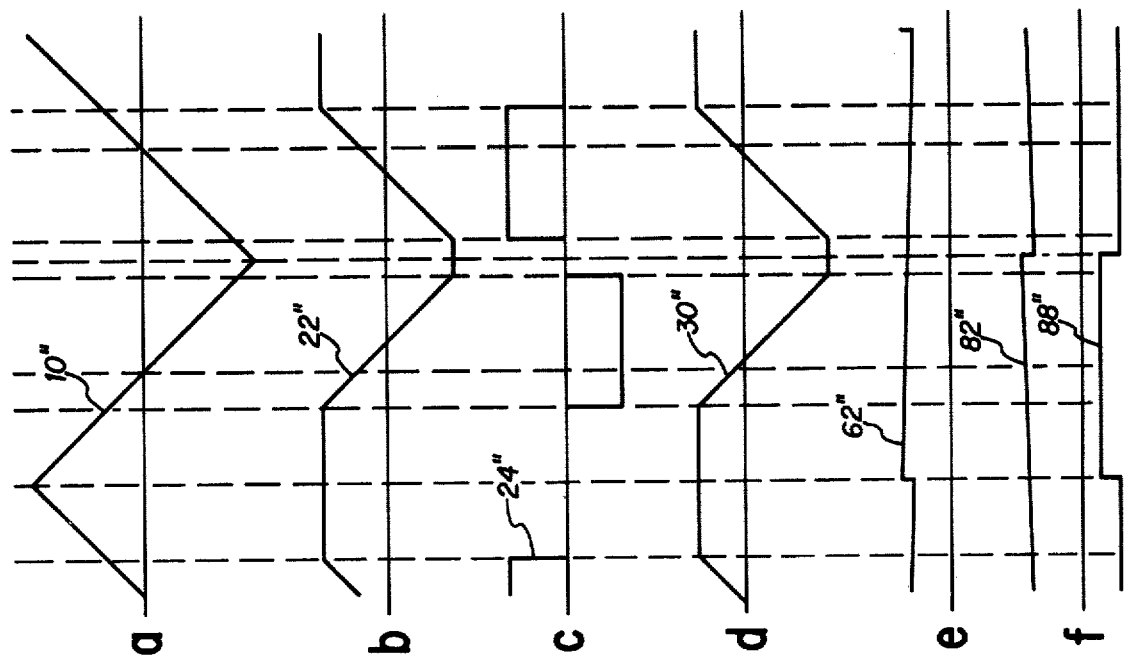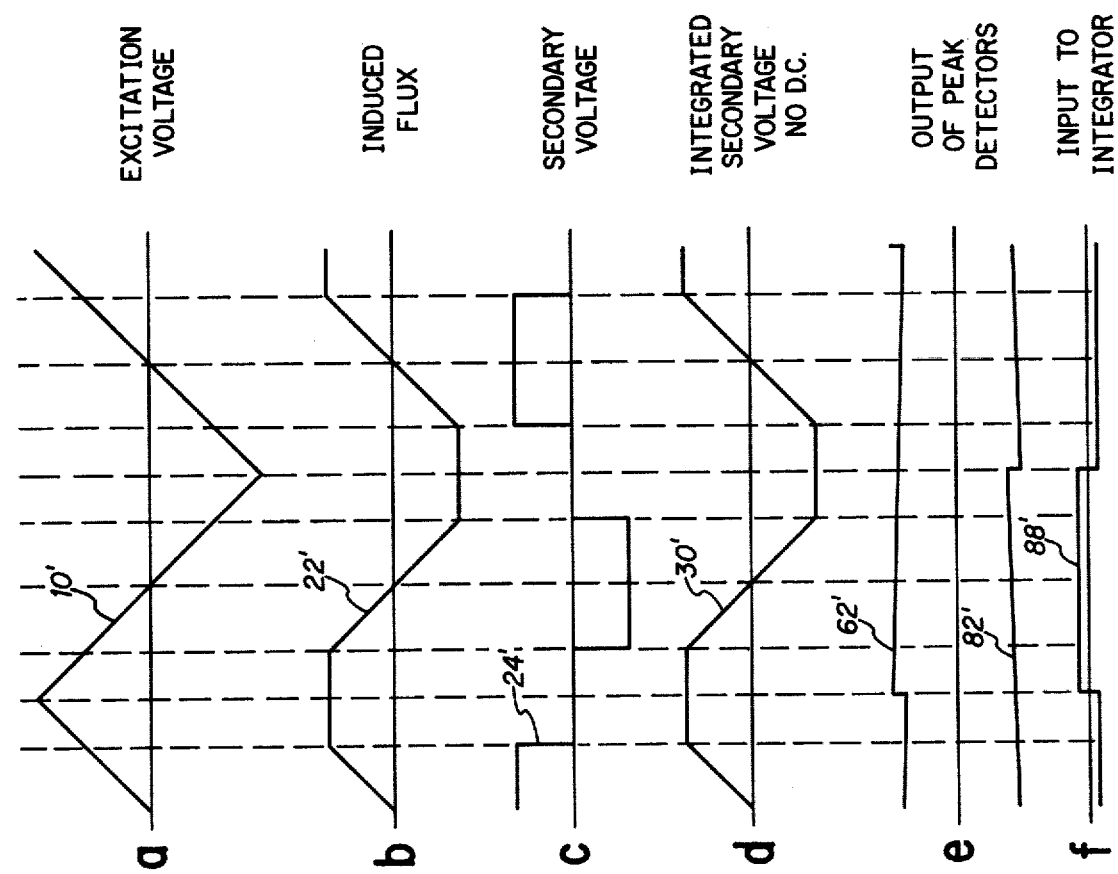

MAGNETIC FIELD AMPLITUDE DETECTION SENSOR APPARATUS

THE INVENTION

The present invention is directed generally to electronics and more specifically to magnetic field sensing apparatus.

While there are obviously many types of magnetic field sensors available in the prior art and some magnetic field sensors use very similar sensing mechanisms such as co-pending applications 068,840, 068,839, 068,831 and 068,838 filed in the name of Melvin H. Rhodes and assigned to the same assignee as the present invention and filed even date herewith, the present invention is believed patentably distinct therefrom in view of the design approach of the electronics in converting the information from the sensing mechanism to a usable output for application to a load.

The present invention utilizes a magnetic sensing device which is bidirectionally driven to saturation on a periodic basis. This driving signal can take various forms such as sinusoidal or triangular. An output is obtained from the sensor only when the flux level is changing in the sensing device. If there is no external field present, the half-wave outputs from the sensing device will be equally spaced and of equal amplitudes. However, the outputs will be unequally spaced if there is an external field present which disrupts the symmetry of saturating conditions in the core material. In recognition of this situation, the output of the sensor is amplified to provide a square wave which is integrated after removal of any DC components to provide a signal whose waveform is representative of the flux level changes in the core of the magnetic sensor while being devoid of any DC component. If there is no external field affecting the sensor, the positive and negative peak values of the integrated signal will be equal. However, they will be unequal if there is an external magnetic field affecting the output of the sensor. By sensing these peak values separately and combining them, a voltage may be obtained which is indicative of the DC component removed in the integration process and further indicative of the external magnetic field affecting the core of the sensor. This DC component can be accumulated in further integrating apparatus to provide an output signal which is indicative in polarity and magnitude of the direction of the magnetic field and this signal can be used as a feedback to cancel the effects of the magnetic field thereby minimizing distortion components in the sensing device. As will be realized, when two sets of electronics are used with one set for each magnetic core and associated set of coils, a 360 degree indication of magnetic field strength is obtained using sine and cosine principles. However, a single core, coils and set of electronics may be used to measure the field strength component in any given direction wherein the direction is defined by a line passing through the axis of the core.

In view of the above it is an object of the present invention to provide an improved magnetic field strength sensing and measuring device.

Other objects and advantages of the present invention may be ascertained from a reading of the specification and appended claims in conjunction with the drawings wherein:

FIG. 1 is a block schematic diagram of the inventive concept;

FIG. 2 is a set of waveforms used in conjunction with FIG. 1 and illustrates the signals at various points in FIG. 1 when there is no external magnetic field being sensed; and FIG. 3 is a set of waveforms used in explaining FIG. 1 and illustrates the waveforms of signals at various points in the circuit of FIG. 1 when there is an external magnetic field present and before feedback returns the system to a static condition.

DETAILED DESCRIPTION

Figure 1:
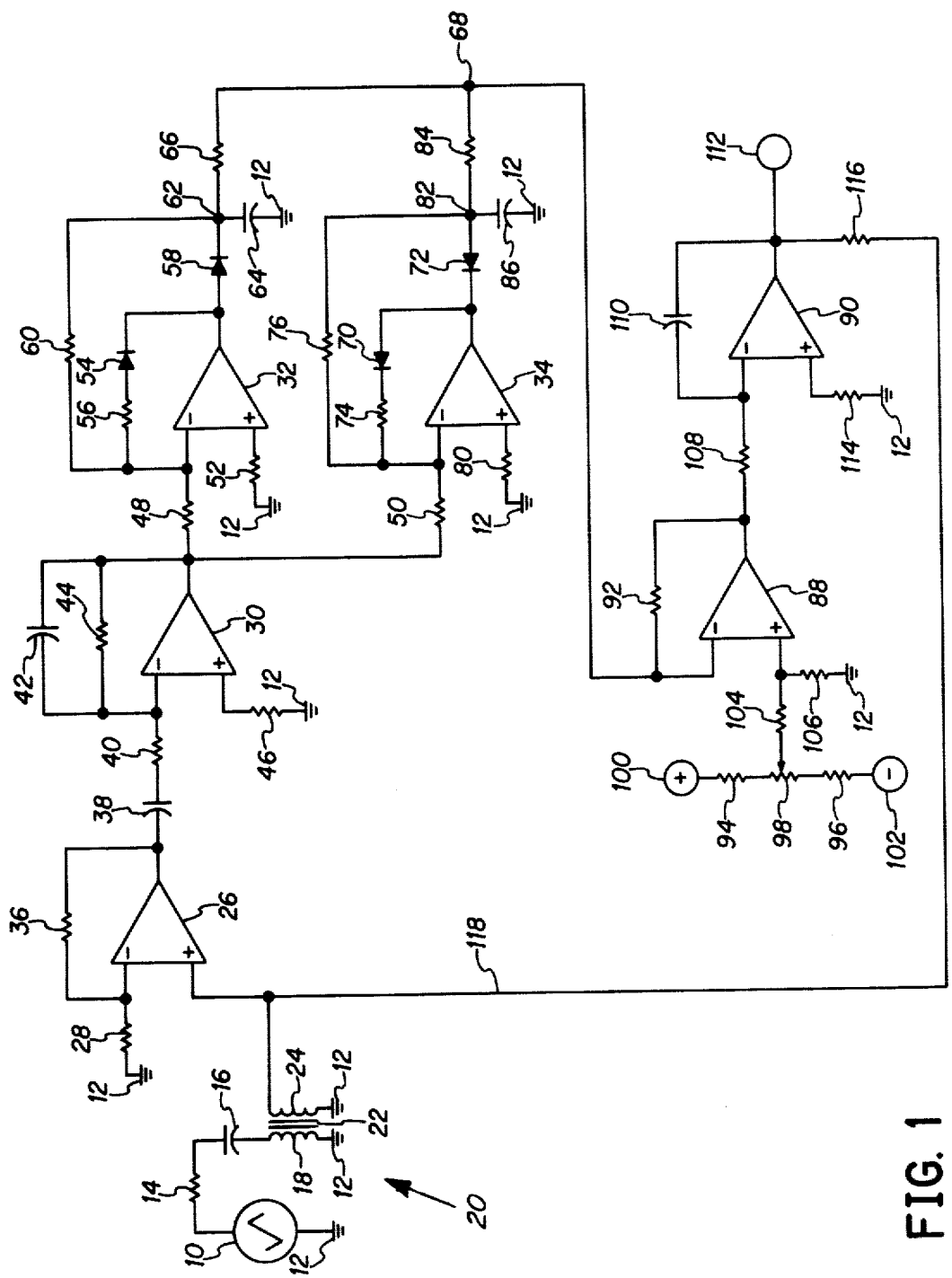

A signal generator 10, which in one embodiment of the invention used triangular waveform excitation signals, is connected between ground 12 and one lead of a resistive element 14 having its other end connected to a DC blocking capacitor 16. A coil or winding 18, used as part of a sensing apparatus 20, is connected between ground 12 and the other lead of capacitor 16. The composite sensing apparatus 20 also includes a core 22 and a second winding 24. The windings 18 and 24 are both wrapped around the core 22 such that the core material in a preferred embodiment is nearly exactly as long as the coil but does not extend beyond the last turns of the coil on either end. In a preferred embodiment this was accomplished by using several 0.005 inch diameter wires of permalloy (obtained from Magnetics, division of Spang Industries, Inc. of Butler, Pennsylvania) inserted in a 0.060 inch OD ceramic tube. Two layers of 40 gauge wire comprise winding 18 and an additional two layers of 40 gauge wire comprise winding 24.

The winding 24 is connected between ground 12 and a plus or non-inverting input of a first differential amplifier 26. A resistive element 28 is connected between ground 12 and the negative or inverting input of amplifier 26. Amplifier 26, as well as further amplifiers 30, 32 and 34 in a preferred embodiment comprise LM101A amplifiers as obtained from National Semiconductor.

A feedback resistor 36 is connected between the output of amplifier 26 and the inverting input. A DC blocking capacitor 38 is connected in series with a resistor 40 between the output of amplifier 26 and the inverting input of amplifier 30. A capacitor 42 is connected in parallel with a resistor 44 in a feedback fashion around amplifier 30 between its output and its inverting input. A further resistive element 46 is connected between the non-inverting input of amplifier 30 and ground 12. The amplifier 30 in combination with components 42 and 44 perform an integrating and filtering function. An output of amplifier 30 is connected to one end of each of resistors 48 and 50. The other end of resistor 48 is connected to the inverting input of amplifier 32 which has its non-inverting input connected to one end of a resistor 52. The other end of resistor 52 is connected to ground 12. A diode 54 and a resistive element 56 are connected in series as a first feedback path between the output of amplifier 32 and its inverting input. A second diode 58 is connected in series with a resistor 60 as a second feedback path in parallel with resistor 56 and diode 54. As illustrated, these diodes are connected in opposite directions. Amplifier 32 and its associated components comprise a peak voltage detector. An output for this peak detector is obtained between diode 58 and resistor 60 at junction point 62. A capacitor 64 is connected between junction point 62 and ground 12. A resistor 66 is connected between junction point 62 and a further junction point 68. The amplifier 34 also performs peak voltage detection and has similar feedback paths comprising diodes 70 and 72 and resistors 74 and 76. Further, a resistive element 80 is connected between the non-inverting input of amplifier 34 and ground 12. A junction point 82 provides the output of the peak detector utilizing amplifier 34. A resistor 84 is connected between junction points 68 and 82 while a capacitor 86 is connected between junction point 82 and ground 12. Junction point 68 forms the summing junction for the outputs of the two peak detectors and this output or junction point is connected to the inverting input of a differential amplifier 88. Amplifier 88, as well as a further amplifier 90 in a preferred embodiment, were LM108A's as obtained from National Semiconductor. A feedback resistor 92 is connected between the output of amplifier 88 and its inverting input. An offset voltage compensating network comprising a pair of resistors 94 and 96 along with a potentiometer 98 is connected between positive and negative potential sources 100 and 102. A resistor 104 is connected between the wiper of potentiometer 98 and the non-inverting input of amplifier 88. A resistance element 106 is connected between the non-inverting input of amplifier 88 and ground 12. A resistive element 108 is connected between the output of amplifier 88 and the inverting input of amplifier 90. An integrating or signal accumulating feedback capacitor 110 is connected between an output of amplifier 90 and the inverting input. The output of amplifier 90 comprises a terminal 112 which provides apparatus output signals indicative of the magnetic field being sensed by sensing device 20. A resistive element 114 is connected between ground 12 and the non-inverting input of amplifier 90. Finally, a resistive element 116 is connected between junction point 112 and the non-inverting input of amplifier 26 on a lead 118.

The excitation voltage shown in waveform a of FIG. 2 and labeled 10' was, in one embodiment of the invention, a 400 cycle triangular waveform. The waveform b of FIG. 2 is given a designation of 22' as an indication that this represents the flux in core 22. Waveform c of FIG. 2 illustrates the output signals from sensor winding 24 and thus this waveform is designated 24'. Waveform d represents the integrated signals appearing at the output of amplifier 30 and thus is given the representation 30'. The two waveforms in line e represent the outputs from the respective peak detectors at junction points 62 and 82 respectively. In waveform f the signal shown represents the output of amplifier 88 which is input to integrator 90.

The corresponding waveforms in FIG. 3 are given the same numerical designations as in FIG. 2 with an additional prime indication (i.e. 10").

OPERATION

As will be realized, the waveforms presented in FIGS. 2 and 3 are in some instances idealized waveforms and the actual waveforms obtained differ somewhat. However, the system operates as if the waveforms were as shown and thus the explanation will be based on the waveforms which provide a simpler basis for understanding.

It may first be assumed that the excitation voltage from source 10 is applied to winding 18 of sensor 20. With no external field, the induced flux within core 22 is as shown in FIG. 2b. Since the sensor will provide an output voltage only when the flux levels are changing, the square-wave output shown in FIG. 2c will result during the periods that the core is not in saturation. As previously explained, the drive 10 is of such a value that the core 22 is periodically saturated in both directions of excitation each full cycle of the applied voltage. Thus, there is no output on winding 24 when the core is saturated. This happens, however, only in an idealized sense, since in actuality most magnetic materials never reach a situation where an increase in current in an excitation winding does not produce any further increase in flux in the core.

To make sure that the output from winding 24 is substantially a square wave as shown in 2c, the amplifier 26 is utilized to increase the signal from winding 24 to a usable voltage level. Capacitor 38 removes any DC components from the incoming signal, and the amplifier 30, in conjunction with capacitor 42, integrates the received signal to provide an output as illustrated in FIG. 2d. The resistors 40 and 44, as well as capacitors 38 and 42, are chosen such that the excitation frequency involved lies in the linear integration portion of the frequency response for the integrator and yet provides further blocking of any unwanted DC signals. If any DC offset were introduced by amplifier 30, it would be passed to the following stage and would give faulty output signals from the peak detectors by adding a DC bias. The embodiment of the circuit using a 400 cycle triangular waveform generator used 0.47 microfarads for capacitor 38, 0.01 microfarads for capacitor 42, 10,000 ohms for resistor 40 and 270,000 ohms for resistor 44. The peak detectors 32 and 34 provide output signals shown in FIG. 2e of the peaks provided in waveform 2d. These outputs are provided at junctions 62 and 82 respectively. Through the use of resistors 66 and 84 in combination with amplifier 88, these signals are summed and supplied to the integrator or accumulator using amplifier 90. The resistors connected to the non-inverting input of amplifier 88 are used to prevent any bias within amplifier 88 from affecting the operation of integrator 90. Since FIG. 2 assumes that there is no external field, it will be noted that the input to integrator 90 has the indentical positive and negative portions relative to ground and thus over the long term provides no net effect at output 112. Thus, there is no return current on lead 118 to affect sensor 20.

Assuming that a component of an external field is sensed along the coil axis as illustrated in FIG. 3, there will be an additive effect between this field and the field produced by the excitation 10 to the primary winding 18. Since the total amount of flux needed to provide saturation to the core 22 remains the same, a lower excitation voltage is required to saturate the material in the additive direction and a higher voltage is required in the subtractive direction. This is illustrated in FIG. 3 where saturation is shown to occur at an earlier position in time relative to excitation voltage 10'. It may thus be noted that the core 22 is in saturation and the saturation time is longer for one polarity of excitation than the other and thus if the curve or waveform 22" were representative of voltage rather than flux, there would exist a net DC level, due to these altered conditions, relative to ground. The secondary winding 24 still produces an output when there is a change of flux which is proportional to the derivative of the flux in the core as illustrated in FIG. 3c. Also, the amplifier 26 again amplifies this voltage to a usable level and under actual operating conditions improves the waveshape. The amplified signal is integrated in integrator 30 where the DC component is removed thereby resulting in a signal which, if not for the removal of the DC component, would be substantially identical and proportional to the waveform illustrated in FIG. 3b. Since, however, the signal from this stage has no DC component, the positive and negative peaks are unequal. The value of the DC component removed is an indication of the strength of the external field causing said component. This DC level can be determined by detecting and storing the positive and negative peaks of the signal by peak detectors 32 and 34 as represented by waveforms 62" and 82". These signals are summed by amplifier 88 to produce the waveform 88" of FIG. 3f. Although there is a ripple superimposed upon the DC voltage of interest due to the leakage of the capacitors used, this ripple is greatly reduced by the integrating action of amplifier 90 in combination with integrating capacitor 110. Since this is a closed loop system, this signal is fed back on lead 118 as a feedback signal. The feedback current has a lower impedance to ground through the coil 24 than through amplifier 26 and thus it travels to ground through coil 24 to produce a magnetic field opposite the external field being measured. At steady state conditions, the feedback current will be of a value to produce a field substantially equal and opposite to the external field thereby providing a stable situation substantially identical to that illustrated by the waveforms of FIG. 2.

As will be realized by those skilled in the art, the peak detectors utilizing amplifiers 32 and 34 are detecting changes in voltages which are very small and thus even a few millivolts of error introduced by faulty peak detectors can bias the output voltage substantially. Thus, the peak detectors illustrated are a preferred design although obviously other types of peak detectors may be usable in practicing the present invention.

In summary, the present invention utilizes a bidirectionally saturating sensor to provide an output signal which is processed to produce a signal representative of flux in the core of the sensor minus any DC components. This signal is then peak detected to determine the value of the DC component removed since this DC component is representative of any external field affecting the flux levels in the sensor. By accumulating the detected values, an output may be obtained indicative of external field being sensed and this signal may further be used in a feedback fashion to minimize flux in the sensor under a zero voltage excitation condition such that the sensor is used in an accurate and stable condition and whereby saturation in both directions is assured with the applied excitation signal.

It is to be realized by those skilled in the art that the inventive concept may be practiced using various other electronic circuits and we thus wish to be limited only by the scope of the appended claims wherein,

We claim:

1. Flux detection apparatus comprising in combination:
    magnetic sensor means;
    excitation means, connected to said sensor means, for bidirectionally saturating said sensor means;
    integration means, connected to said sensor means, for providing a volt-second product, unbiased with respect to reference potential, output first signal representative of flux level changes in said sensor means;
    peak detector means, connected to said integration means, for providing output second signals indicative of the summed average of signal peaks of said first signal;
    feedback means, connected to said detector means, for accumulating received second signals to form a third signal, indicative in polarity and amplitude of an external field being sensed; and
    means supplying said third signal to said sensor means for substantially canceling the effects of external fields on flux levels in said sensor means.

2. Apparatus as claimed in claim 1 wherein said peak detector means comprises:
    first detector means for detecting positive peaks relative to said reference potential; and
    second detector means for detecting negative peaks relative to said reference potential.

3. External magnetic field detection means comprising in combination:
    bidirectionally saturating magnetic sensing means including output winding means wound on a magnetic core for outputting a first signal indicative in polarity of direction of flux level changes in the core;
    integrating second means, connected to said sensing means, for outputting, in response to said first signal, a integrating second signal having an average value of zero with respect to a reference potential and representative in waveshape of flux level changes in said core;
    detection means, connected to said second means, for providing an output third signal indicative of the average of opposite polarity peaks of said second signal with respect to said reference potential; and
    feedback means, including integration means, connected between said detection means and said sensing means, for generating feedback and apparatus output signals indicative of the accumulated average of said third signals and thus of the flux level being measured.

4. The method of measuring magnetic field strength comprising the steps of:
    bidirectionally saturating a directional magnetic core sensor;
    detecting induced voltages generated by said sensor due to flux level changes in the core thereof;
    removing DC components from the induced voltages generated by said sensor while simultaneously integrating the induced voltages;
    peak detecting the integrated signal relative ground for both positive and negative polarities;
    summing the peak detected signals to produce a first signal indicative of the removed DC component;
    integrating said first signal to provide a second signal indicative of external magnetic fields affecting flux levels in the core of said sensor; and
    applying said second signal to said sensor in a feedback manner to cancel the effects of external fields on flux levels in the core of said sensor.

5. Apparatus for measuring magnetic field strength comprising in combination:
    directional magnetic core sensor means;
    first means for bidirectionally saturating said directional magnetic core sensor means;
    second means, connected to said sensor means, for detecting induced voltages generated by said sensor means due to flux level changes in the core thereof;
    third means, connected to said second means, for removing DC components from the induced voltages generated by said sensor means while simultaneously integrating the induced voltages;

fourth means, connected to said third means, for peak detecting the integrated signal relative ground for both positive and negative polarities;

fifth means, connected to said fourth means, for summing the peak detected signals to produce a first signal indicative of the removed DC component;

sixth means, connected to said fifth means, for integrating said first signal to provide a second signal indicative of external magnetic fields affecting flux levels in the core of said sensor; and seventh means, connected between said sixth means and said sensor means, for applying said second signal to said sensor means to cancel the effects of external fields on flux levels in the core of said sensor means.

6. The method of measuring magnetic field strength comprising the steps of:

bidirectionally saturating the magnetic core of a magnetic sensor;

generating a first signal by removing any DC voltage component from induced alternating signals output by said sensor;

operating upon said first signal to generate a second signal representative of the algebraic sum of the peak values of said first signal;

integrating said second signal to provide an output third signal indicative of external magnetic fields affecting said sensor; and returning said third signal to said sensor as a feedback signal to cancel the effects of said external fields on flux levels in the core of said sensor.

7. Apparatus for measuring external magnetic fields comprising in combination:

bidirectionally saturating magnetic sensor means including induced output voltage winding means;

first means, connected to said winding means, for generating a first signal voltage representative of flux levels in said magnetic sensor less any DC component;

second means, including integration means, connected to said first means, for accumulating peak values of said first signal voltage and generating an integrated output second signal indicative of any external magnetic field affecting said sensor means; and third means, connected between said second means and said sensor means, for returning said third signal as a feedback signal.

* * * * *